United States Patent [19]

Datsikas

[11] Patent Number: 5,585,721
[45] Date of Patent: *Dec. 17, 1996

[54] INDUCTIVELY COUPLED DEDICATED RF COILS FOR MRI

[75] Inventor: Thomas Datsikas, Great Neck, N.Y.

[73] Assignee: Fonar Corporation, Melville, N.Y.

[ * ] Notice: The portion of the term of this patent subsequent to Nov. 16, 2013, has been disclaimed.

[21] Appl. No.: 719,926

[22] Filed: Jun. 24, 1991

[51] Int. Cl.$^6$ .................................................. G01V 3/00
[52] U.S. Cl. .................................... 324/318; 324/322
[58] Field of Search .............................. 324/318, 322, 324/307, 313, 309; 333/219

[56] References Cited

U.S. PATENT DOCUMENTS

| | | | |
|---|---|---|---|
| 4,733,190 | 3/1988 | Dembinski | 324/318 |
| 4,918,388 | 4/1990 | Mehdizadeh et al. | 324/322 |
| 4,920,318 | 4/1990 | Misic et al. | 324/318 |
| 5,003,265 | 3/1991 | Leussler | 324/318 |

*Primary Examiner*—Louis M. Arana
*Attorney, Agent, or Firm*—Brooks Haidt Haffner & Delahunty

[57] ABSTRACT

A dedicated RF coil for MRI comprising tuned primary and secondary circuits having primary and secondary inductors which are inductively coupled. The primary and secondary inductors have respective spatial regions of sufficiently uniform sensitivity for the MRI study to be carried out which substantially totally overlap. A port in the secondary circuit permits the transfer of RF energy between the tuned secondary circuit and an external device.

36 Claims, 5 Drawing Sheets

INDUCTIVELY COUPLED DEDICATED RF COILS FOR MRI

BACKGROUND OF THE INVENTION

The present invention relates to dedicated radio frequency coils for use in magnetic resonance imaging (MRI) of biological subjects, and more particularly tuned inductively coupled coils of this type.

The development of dedicated radio frequency (RF) coils has long been a topic of interest in the MRI field. A useful introduction to the subject can be found in the article by W. T. Sobel, "Dedicated Coils in Magnetic Resonance Imaging", Reviews of Magnetic Resonance in Medicine, Vol. 1, No. 2, pp. 181–224 (1986). In his paper Sobel distinguishes between magnetic resonance imaging (MRI) and magnetic resonance spectroscopy (MRS). The same distinction is made in the present specification, in which references to imaging refer to two-dimensional Fourier transform imaging (which may be derived from spectral information) as opposed to spectroscopy which involves the reproduction of a nuclear magnetic resonance spectrum.

Several RF coil features and parameters directly affect its suitability for use in magnetic resonance imaging. Ideally, the coil would have a high uniform sensitivity within a particular spatial region of interest, and low sensitivity elsewhere, with a resulting high signal-to-noise ratio (SNR). The coil would be large enough to achieve the spatial coverage desired, but small to achieve a high fill factor, to fit within the MRI system magnet and to conform comfortably to the body of a subject. The RF coil must resonate at approximately the Larmor frequency of the nuclei used to develop the MRI signal, so that neither the coil size nor geometry can create an inductance or self-capacitance which prevents tuning to the desired frequency. The coil must also couple to the MRI system amplifier stages efficiently.

One technique for coupling the RF coil to the imaging system amplifier stage is inductive coupling. In this scheme a primary winding is positioned proximate the part of the subject which is to be imaged and a second winding, typically a single loop, is positioned adjacent the primary winding for inductively coupling with it. The secondary loop is coupled to the MRI system amplifier. Magnetic resonance signals are excited within the subject under magnetic field conditions to permit imaging and are received by the primary winding. Current flowing in the primary winding induces a voltage in the secondary winding which is amplified and processed to develop an image.

At this juncture there is no comprehensive analysis of inductively coupled RF coils for MRI. The importance of the degree of inductive coupling between the primary and secondary coils, their relative spatial positions and respective geometries, and how these factors fit into the other aspects of RF coil design mentioned above, remain largely unanswered. The various inductively coupled RF coils analyzed in the literature appear to be special cases of the general problem.

The article by W. Froncisz et. al., "Inductive (Flux Linkage) Coupling to Local Coils in Magnetic Resonance Imaging and Spectroscopy, Journal of Magnetic Resonance 66, 135–143 (1986) presents an analysis of an inductively coupled coil for use in MRI. The secondary coil is an untuned single loop and its sole purpose is to couple the primary coil to a receiver. The article concludes, among other things, that detuning can be minimized by making the secondary coil with the smallest possible inductance and coupled as tightly as possible to the primary coil.

A loop array structure was proposed by C. Leussler et. al. "Optimized RF Coils for Low Field MRI", Proc. SMRM 1989, p. 938, for applications where solenoids previously had found use. They disclose a head coil comprised of eleven turns and a body coil of eight turns, wherein each turn is a single loop LC resonator. Each resonator is tuned to the same frequency. The article presents data to show that the Q of the loop array is degraded less than the Q of the selonoid when loaded, over a frequency range of about 2.5 to 25 MHz.

Signal-to-noise ratio was considered in the article of D. J. Gilderdale et. al. "The Performance of Mutually-Coupled Coils for Magnetic Resonance Signal Recovery", Proc. SMRM, p. 956 (1989). The authors concluded that in an inductively coupled coil system, the best SNR is obtained when the primary and secondary coils are slightly overcoupled and the lower frequency peak of the coil system frequency response in tuned to the frequency of interest.

The SNR of inductively coupled systems in which the secondary coil is significantly larger than the primary coil was investigated in the paper by S. N. Wright, "Estimation of the SNR Loss Due to Inductive Coupling Loops". Proc. SMRM, p. 955 (1989). The paper concludes that there will be less than a five per cent drop in SNR of the coupled system relative to the primary alone, if the input resistance of the system is greater than ten times the primary coil resistance.

Finally, L. Darrasse, et al. "Optimization of Receiver Coil Bandwidth by Inductive Coupling", Proc. SMRM, p. 1340 (1990) discloses a strongly overcoupled inductively coupled coil having a large bandwidth for fast scanning on a low field MRI system.

Significantly, the prior art frequently relies on an analysis of inductively coupled coils which is based on a lumped parameter circuit model. There is little if any consideration of the spatial sensitivity distribution of the primary coil, and usually there is a tacit assumption that the NMR signal is received by only the primary coil, and then inductively coupled to the secondary coil. Additionally, signal-to-noise ratio is evaluated in terms of the NMR signal voltage and the noise voltage which is output from the secondary coil; not the SNR of the image which is ultimately formed. However, the spatial sensitivity of the coil system can play a determinative role in the image SNR that is achieved.

SUMMARY OF THE INVENTION

It is an object of the invention to provide a dedicated inductively coupled RF coil for magnetic resonance imaging which achieves good signal-to-noise ratio in the resulting image over a desired field of view.

Another object of the invention is to provide a dedicated inductively coupled RF coil which can easily be resonated at the hydrogen Larmor frequency for mid-range magnetic field strengths.

Another object of the invention is to provide a dedicated inductively coupled RF coil for MRI which can be conveniently configured for a particular anatomical study of humans without substantially sacrificing image signal-to-noise ratio, field of view, and the ability to resonate at the hydrogen Larmor frequency for mid-range magnetic field strengths.

According to the invention a dedicated radio frequency coil for MRI is comprised of a tuned primary circuit and a tuned secondary circuit. Each of the tuned circuits is comprised of a capacitor and an inductor connected in series. The primary and secondary inductors are each dimensioned and shaped for defining a spatial region in which the coil sensitivity is sufficiently uniform for the MRI study which it is used to carry out. The primary and secondary inductors are positioned for inductively coupling the primary and secondary tuned circuits, and a port is provided for transferring radio frequency energy between the tuned secondary circuit and an external device. The primary and secondary inductors are dimensioned and shaped for defining respective spatial regions of sufficiently uniform sensitivity which substantially totally overlap for increasing the coil sensitivity relative to a single inductor within a particular field of view.

In one embodiment the primary inductor is a pair of spaced conductive loops, each tuned by a respective capacitor, and each inductively coupled to the secondary coil. Another primary structure is a pair of conductive loops disposed cylindrically symmetrically, and spaced from each other a distance approximately equal to the radius of the conductive loops, with each conductive loop comprising a single discontinuous loop having a gap between a pair of confronting ends. A pair of links are each connected between a respective end of one loop and the corresponding end of the other loop for connecting the pair of primary loops in parallel. The secondary circuit inductor is comprised of a pair of loops connected in parallel like the primary inductor.

In another preferred embodiment of the invention, the primary and secondary inductors are flexible and disposed on a flexible sheet of insulative material. The insulative sheet and flexible loop combination can be wrapped around a part of the anatomy of a subject conveniently and comfortably while obtaining the desired characteristics of the dedicated coil for imaging.

BRIEF DESCRIPTION OF THE DRAWING

The invention will be readily understood from the detailed description and the accompanying drawing in which.

DETAILED DESCRIPTION OF THE PREFERRED EMBODIMENTS

Figure 1:
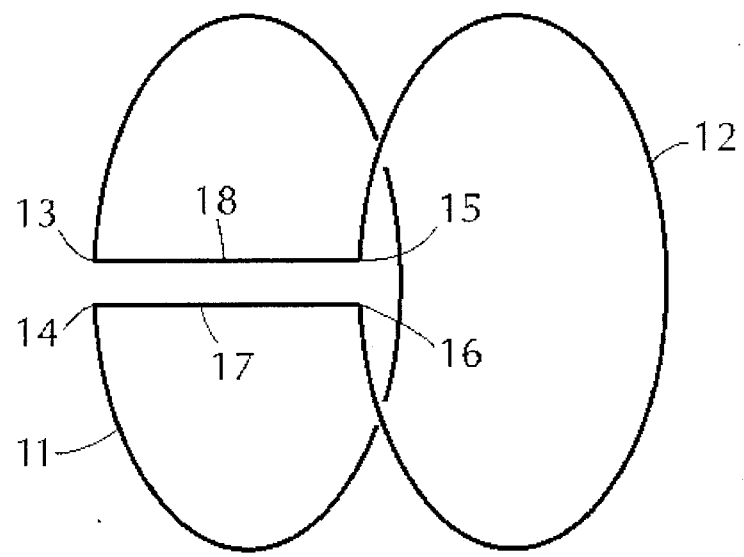
FIG. 1 is an isometric view of an inductor used in dedicated RF coils according to the invention.

FIG. 1 illustrates a basic building block of several different embodiments of the invention. The structure is comprised of a first loop 11 and a second loop 12, with the planes of the two loops parallel. The loop 11 is discontinuous with a pair of confronting ends 13, 14 and a gap between them. The loop 12 is likewise discontinuous with a gap between its confronting ends 15, 16. Respective ends of each of the loops 11 and 12 are connected together by conductive links 17 and 18. Thus, loop ends 14 and 16 are connected by the link 17, and loop ends 13 and 15 are connected together by the link 18. As a consequence of this structure, the loops 11 and 12 are connected electrically in parallel.

In a preferred embodiment the two loops 11, 12 are circular, and the spacing between them is equal to the loop radius. This is the same spacing as the known Helmholtz pair, however, in the present invention the spacing between the loops is permitted to differ somewhat from a distance equal to the loop radius. If the loop spacing differs from the ideal distance of a loop radius, then it is preferred that the loops be closer rather than further apart.

Figure 2:
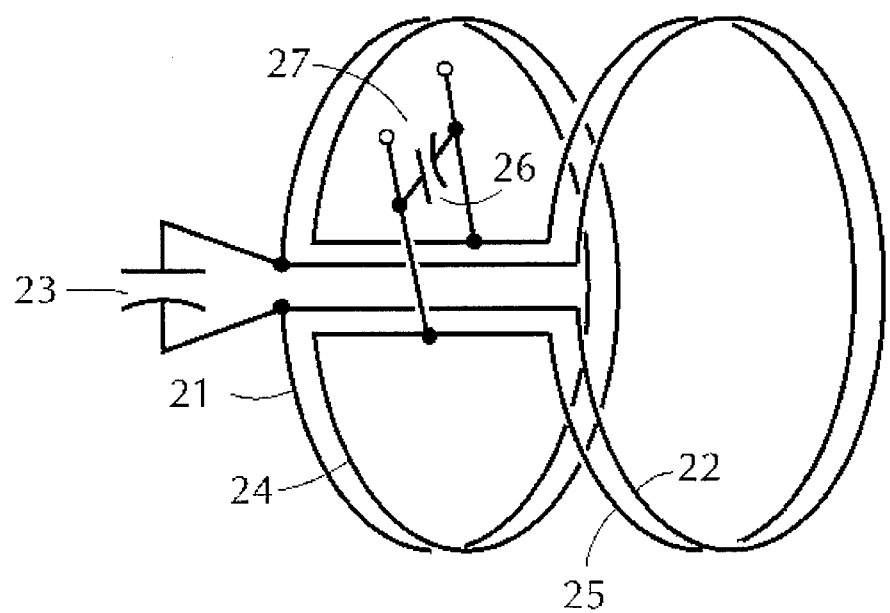
FIG. 2 is an isometric view of a dedicated RF coil according to the invention having primary and secondary inductors with the structure shown in FIG. 1.

FIG. 2 illustrates a dedicated RF coil which incorporates the parallel connected double loop structure just described. The coil is comprised of a primary inductor having a first loop 21 and a secondary loop 22 spaced from it by a distance equal to about the loop radius. The primary inductor loops 21 and 22 are connected in parallel and a tuning capacitor 23 is connected in series with the parallel loop combination. A secondary inductor is similarly comprised of a first loop 24 and a second loop 25 which are positioned between and adjacent the primary inductor loops. More particularly, the secondary inductor loop 24 is adjacent the primary loop 21, and the secondary inductor loop 25 is adjacent the primary loop 22. As a consequence, the spacing between the secondary inductor loops 24 and 25 is also about equal to the loop radius. A capacitor 26 is connected in series with the secondary inductor loops 24, 25 so as to form a tuned secondary circuit. A port 27 shown in the form of a terminal pair is provided to permit the transfer of RF energy between the secondary circuit and an external device. The inductor comprised of loops 24 and 25 need not be the secondary inductor. Instead, the inductor comprised of loops 21 and 22 could have been the secondary inductor with the port 27 across the capacitor 23. Loops 24 and 25 would then comprise the primary inductor.

Figure 3:
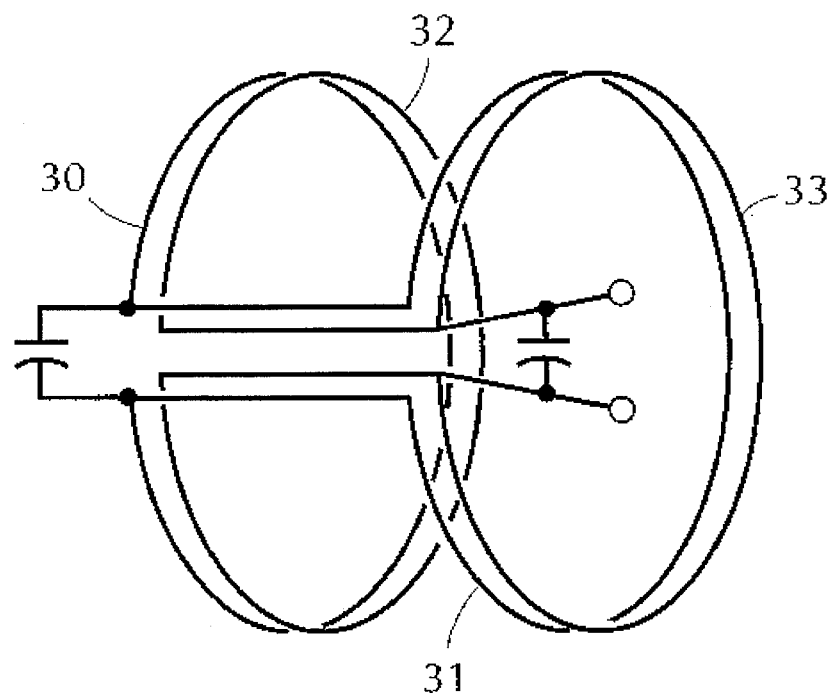
FIGS. 3 and 4 illustrate another embodiment of the dedicated RF coil according to the invention comprising primary and secondary inductors having the structure shown in FIG. 1.
Figure 4:
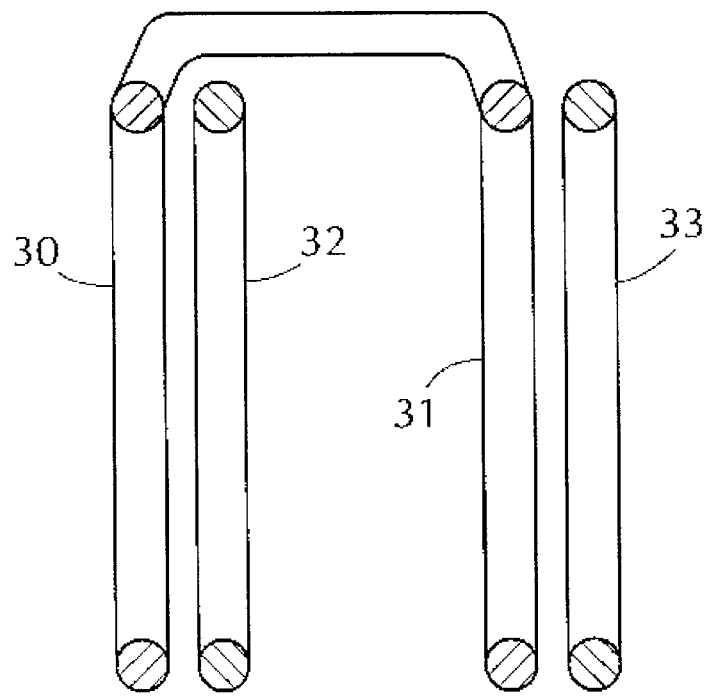

In FIGS. 3 and 4 the illustrated dedicated RF coil has exactly the same spacing between the primary inductor loops as the secondary inductor loops. Thus, loops 30 and 31 together comprise the primary inductor and loops 32 and 33 together comprise the secondary inductor. The distance between the loops 30 and 31 is equal to the distance to the distance between the loops 32 and 33, and ideally the interloop spacing for both inductors is equal to the loop radius. This structure is shown in longitudinal section in FIG. 8 which illustrates that the interloop spacing for both the primary inductor and the secondary inductor are equal.

Because the interloop spacing of both the primary and secondary inductor is equal, either loop pair can be used for the primary or secondary without changing the sensitivity profile of the coil. The fact that the loop pair 32 and 33 is shown as having an output port 34 is arbitrary. The output port could have been equivalently on the loop pair 30 and 31.

Figure 5:
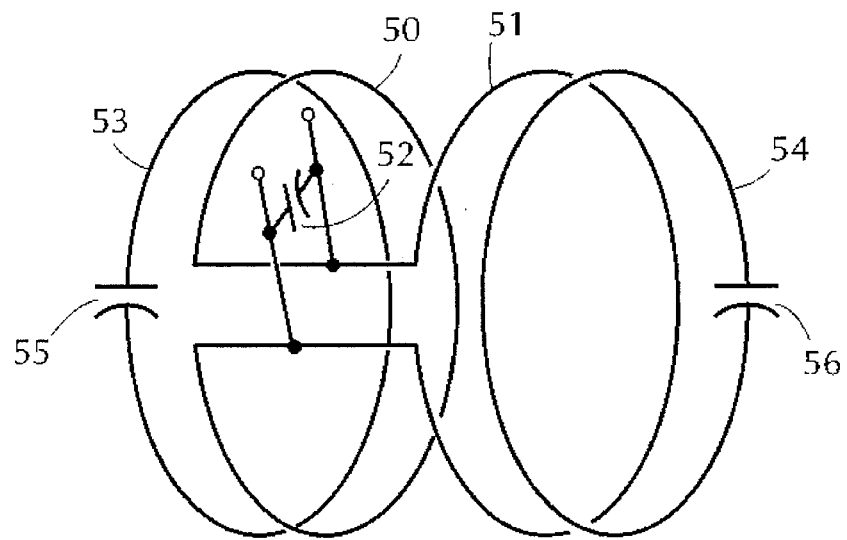
FIG. 5 is an isometric view of another embodiment of the dedicated RF coil according to the invention having a primary inductor comprised of separate loops and a secondary inductor having the structure shown in FIG. 1.

In the present invention the primary inductor loops are inductively coupled to the secondary inductor. There is no requirement that the primary inductor loops be connected, either directly or inductively, to each other. FIG. 5 illustrates an embodiment of a dedicated RF coil having secondary inductor loops 50 and 51 connected in parallel in the manner previously described. Also, like in the previously described embodiments the secondary inductor is tuned by a capacitor 52. There are two unconnected primary inductor loops 53 and 54. The primary loop 53 is adjacent the secondary loop 50, and the primary loop 54 is adjacent the secondary loop 51. Primary loop 53 is connected in series with a tuning capacitor 55, and primary loop 54 is connected in series with a tuning capacitor 56. The primary tuned circuit is thus comprised of a pair of mechanically separate and unconnected loops 53 and 54, both of which are inductively coupled to the secondary inductor 50, 51. As in the previously described embodiments the interloop spacing of the secondary inductor, or the primary inductors, is no greater than about the loop radius.

EXAMPLE

An embodiment of the invention like that shown in FIG. 5 was constructed with dimensions particularly well suited for imaging the human knee. The coil windings were made of copper tubing having a 0.25 inch outer diameter. All four coil loops were circular with an inner diameter of 6.0 inches. The primary windings were spaced 3.0 inches center-to-center and were insulated with a plastic sleeve of 0.020 inch wall thickness. The two secondary loops were in contact with the primary loops insulation sleeves and were spaced approximately 2.7 inches center-to-center. The links connecting the two secondary loops were made of the same copper tubing as the coil loops. The capacitors for the two primary loops and the secondary each had the same nominal value which corresponds to the frequency of operation. For a hydrogen Larmor frequency in the 12 megahertz region corresponding to a magnetic field of around 3000 gauss, capacitor values of 200 picofarads were used. Use of this embodiment of the invention resulted in images which exhibited a high signal-to-noise ratio and good contrast across a field of view as wide as the spacing between the primary inductor loops.

It is sometimes desirable to have available flexible dedicated RF coils. These are useful, for example, in making abdominal images of humans.

Figure 6:
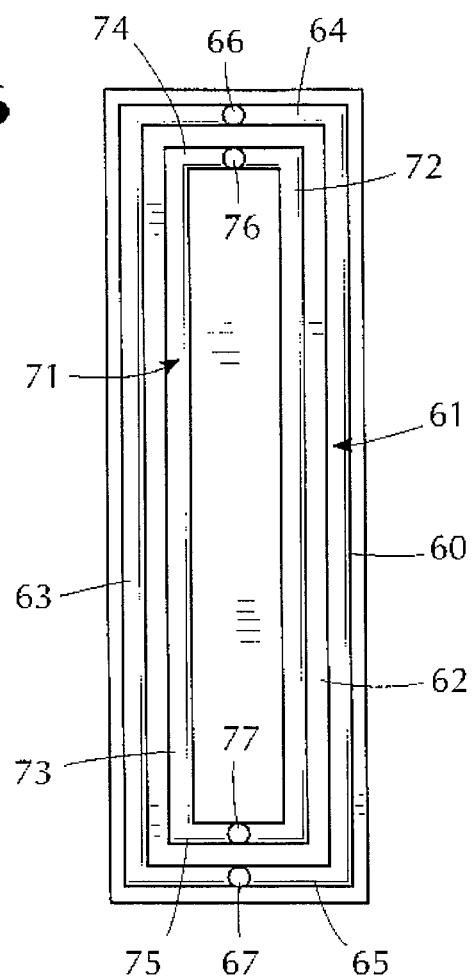
FIG. 6 is a plan view of a flexible dedicated RF coil according to the invention laid out flat.

FIG. 6 illustrates a flexible dedicated RF coil laid out flat. Flexible insulated sheet 60 has a major surface upon which a closed outer conductive loop 61 is disposed. The loop 61 is comprised of a pair of parallel legs 62, 63 extending lengthwise of the loop, and a pair of shorter legs 64, 65 connecting the longer legs 62 and 63 at the ends of the loop. The coil further comprises an inner loop 71 having a pair of parallel longer legs 72 and 73 which extend adjacent and parallel to the longer legs 62 and 63 of the outer loop 61. The inner loop is completed by shorter legs 74 and 75 which connect the longer legs 72 and 73 at the ends of the inner loop 71.

The outer loop 61 has a pair of terminals 66 and 67 at opposite ends of the loop and electrically connected with the loop. The inner loop 71 similarly is provided with terminals 76 and 77 at its opposite ends. Typically, a second flexible insulative sheet (not shown) would overlie the structure shown in the drawing to improve the appearance of the coil and prevent shorting of the inner and outer loops. The terminals 66, 67 and 76, 77 would protrude from such a second sheet.

In use, the coil is wrapped around the part of the person to be imaged, such as the abdomen, so that the outer loop end legs 64 and 65 are adjacent. A capacitor is connected between the terminals 66 and 67 for tuning the inductor formed by the outer loop 61 and a second capacitor is connected between the terminals 76 and 77 for tuning the inductor formed by the inner loop 71. In this way an inductively coupled dedicated RF coil having a tuned primary circuit and a tuned secondary circuit, as in the previously described embodiments, is realized.

Figure 7:
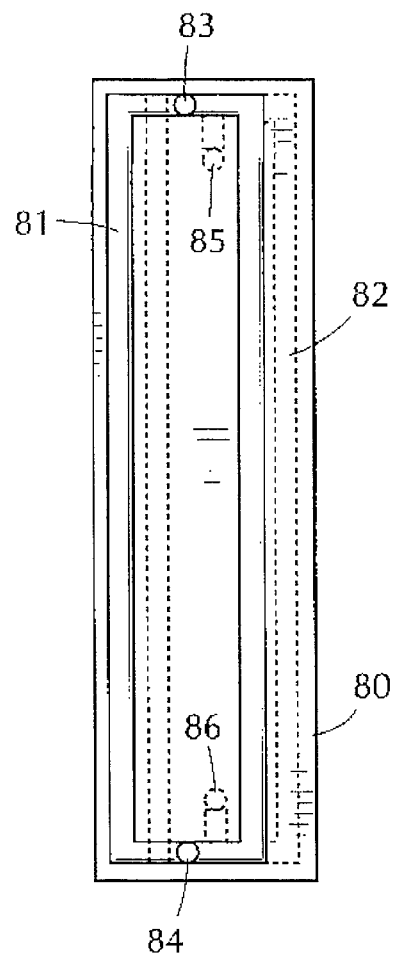
FIG. 7 is a plan view of another embodiment of a dedicated RF coil according to the invention laid out flat.

FIG. 7 illustrates another flexible dedicated radio frequency coil which has a structure corresponding to that shown in FIG. 3. A flexible insulative sheet 80 has a first loop 81 disposed on a major surface of the sheet 80. A second loop 82 (illustrated with dashed lines) is identical to the first loop 81 and is disposed on the opposite major surface of the sheet 80. The first loop 81 is provided with terminals 83 and 84, and the second loop 82 is likewise provided with terminals 85 and 86. Moreover, additional insulative sheets (not shown) are typically provided over the first and second major surfaces of the sheet 80 for covering and insulating the first and second loops 81 and 82.

Figure 8:
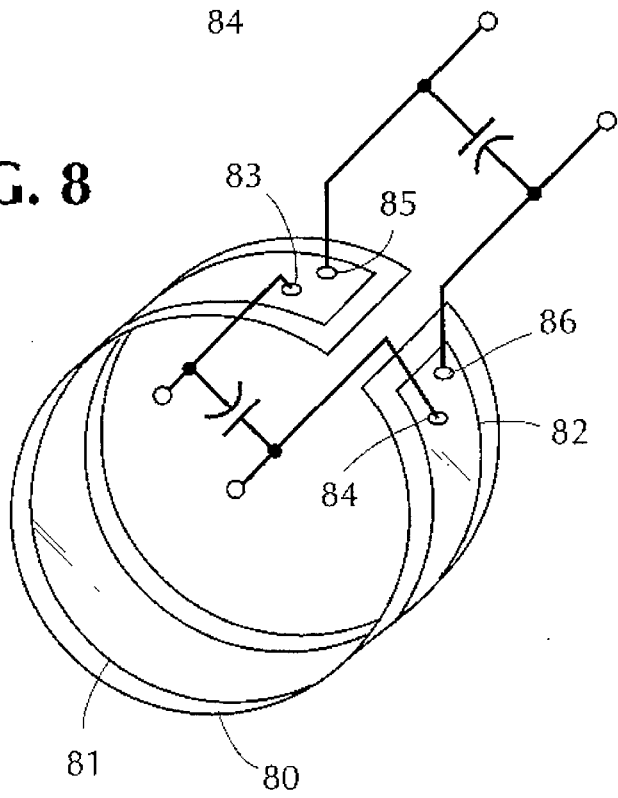
FIG. 8 is an isometric view of the dedicated RF coil shown in FIG. 7 folded to form a loop.
Figure 9:
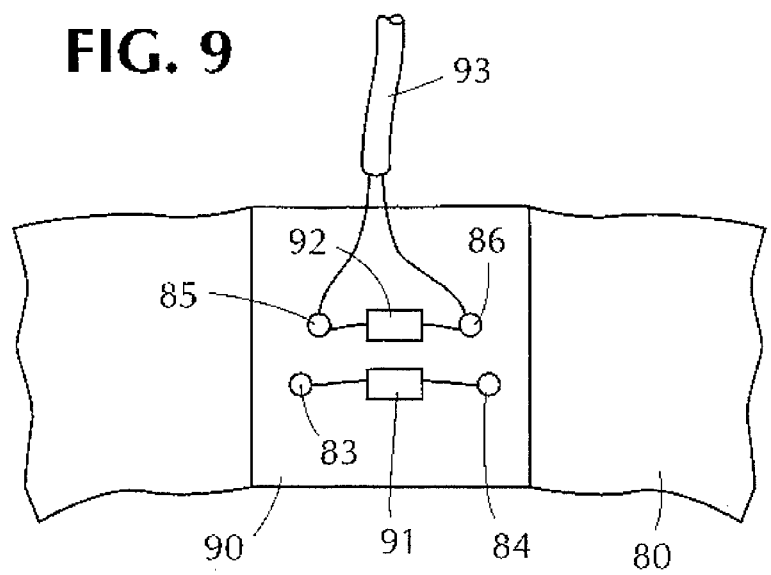
FIG. 9 illustrates a fastener for use with the embodiments of the invention shown in FIGS. 6–8.

The structure shown in FIG. 7 is wrapped so as to form the coil structure shown in FIG. 8, with a pair of tuning capacitors connected across the terminal pairs 83, 84 and 85, 86, respectively. Either terminal pair can be selected as a port for the coil. Structure for holding the coil together and mounting the capacitors is shown in FIG. 9. The structure includes an insulative block 90 having openings for the terminal pairs 83, 84, and 85, 86. Capacitors 91 and 92 are mounted on the block and across the terminal pairs, and a connecting cable 93 is connected for transferring energy between one of the two loops and an external device.

The dedicated RF coils according to the invention are used as receiver coils for magnetic resonance imaging in the conventional manner. A subject is positioned with the part of its anatomy to be imaged within the magnetic field of an MRI system. The RF receiver coil is placed surrounding the part of the anatomy to be imaged and connected to the MRI system receiver preamplifier and the MRI system is operated to generate the magnetic field gradients and RF pulses necessary to stimulate the emission of MRI signals. The RF receiver coil receives the emitted MRI signals which are processed by the MRI system to produce an image.

Another operating mode for the RF coils according to the invention is to use them for the RF transmitter coil of the MRI system as well as the RF receiver coil. The disclosed RF coils have good spatial uniformity of RF energy distribution and permit the application of RF energy just in the region of the anatomy which is to imaged.

One aspect of the imaging process which is necessary to good results is matching of the MRI system receiver to the RF receiver coil. Typically, the RF receiver coil is connected to the MRI system receiver preamplifier through a tuning network that contains a variable capacitance element such as a varactor or a variable capacitor. The value of the capacitance element is varied to compensate for loading of the receiver coil by the subject being imaged after the subject is placed with the receiver coil.

Figure 10:
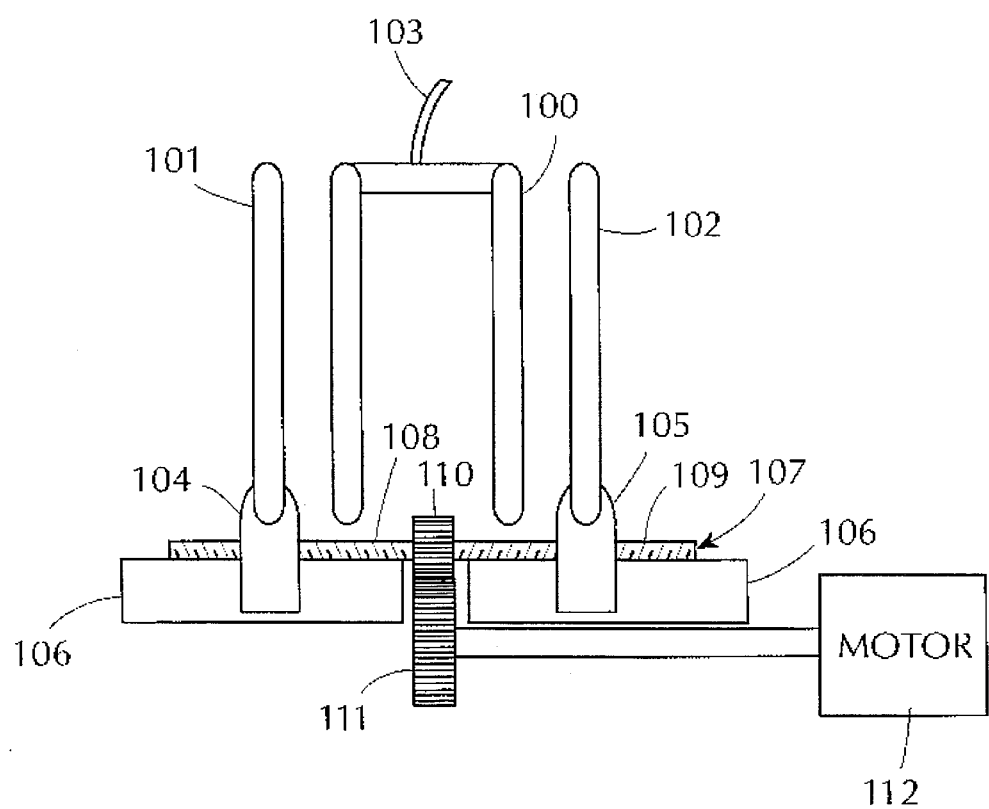
FIG. 10 illustrates structure for adjusting the inductive coupling between the primary and secondary inductors of the invention.

FIG. 10 illustrates an embodiment of the RF coil according to the invention which includes means for varying the inductive coupling between the primary and secondary inductors for compensating for coil loading by the subject being imaged. The secondary inductor 100 is comprised of a pair of loops connected electrically in parallel, and each secondary loop is adjacent to a respective one of the primary inductor loops 101 and 102. A lead pair 103 connects the secondary inductor 100 to the MRI system preamplifier.

Each of the primary inductor loops 101 and 102 has attached to it a corresponding one of the travelers 104 and 105 which are free to travel lengthwise along the guide 106.

Both of the travelers 104, 105 have a threaded bore for receiving a threaded rod 107. The threaded rod 107 has threaded sections 108 and 109 which are threaded with an opposite pitch. A gear 110 is fixed to the threaded rod between the rod sections 108 and 109 and is driven to rotate by the motor 112 through a second gear 111. Because the threads of the rod sections 108 and 109 have an opposite pitch, rotation of the rod 107 will cause the traveler 104 and 105 to move in the direction of the length of the guide 106 either toward each other or away from each other, depending upon which direction the rod 107 is rotated. Consequently, the primary inductor loops 101, 102 will move closer or further from the secondary inductor 100, depending upon the direction of rotation of the rod 107. In this way, the inductive coupling between the primary and secondary inductors can be adjusted.

The embodiment of the invention shown in FIG. 10 is used in the same way as the previously described embodiments. Additionally, before collecting data for an image, MRI signal emission is evoked and the spacing between the primary and secondary inductors is adjusted to obtain maximum MRI signal strength. Then, data collection for imaging is carried out.

The preferred embodiments of the invention disclosed herein are exemplary and should not be considered exhaustive of the scope of the invention. For example, variations in the structure of the mechanism for adjusting the primary and secondary inductor spacing, or a different mechanism, can be used. Non-circular coil loops, and different loop configuration, can also be used. Accordingly, the scope of the invention should be defined by the following claims.

What is claimed is:

1. A dedicated radio frequency coil for receiving MRI data emitted from an anatomical region of interest of a subject, comprising:

(a) a tuned primary circuit comprising a primary inductor and a primary capacitor connected in series, said primary inductor having a first spatial region of substantially uniform sensitivity;

(b) a tuned secondary circuit comprising a secondary inductor and a secondary capacitor connected in series, said secondary inductor having a second spatial region of substantially uniform sensitivity, said secondary inductor being inductively coupled to said primary inductor and positioned proximate said primary inductor such that said first and second spatial regions substantially totally overlap, said overlapping regions defining a region for receiving said anatomical region of interest of said subject, each of said primary and secondary inductors receiving said MRI data from said anatomical region of interest of said subject; and (c) means for transmitting said MRI data from said secondary circuit.

2. The dedicated radio frequency coil according to claim 1, wherein said secondary inductor comprises a pair of loops electrically connected in parallel and having a diameter equal to a diameter of said primary inductor.

3. The dedicated radio frequency coil according to claim 1, wherein said secondary inductor comprises a pair of conductive loops symmetric about a longitudinal axis therethrough and forming a substantially cylindrical shape thereabout, said loops being spaced from each other a distance no greater than about the radius of said substantially cylindrical shape, and means for electrically connecting said pair of loops in parallel.

4. The dedicated radio frequency coil according to claim 3, wherein each of said loops are circular and have the same radius and are spaced apart a distance approximately equal to said radius.

5. The dedicated radio frequency coil according to claim 3, wherein said primary inductor comprises a pair of conductive loops substantially symmetric about said longitudinal axis therethrough and forming a substantially cylindrical shape thereabout, each primary inductor loop having the same radius as said secondary inductor loops and being disposed adjacent and substantially symmetrical with a respective one of said secondary inductor loops for inductively coupling therewith.

6. The dedicated radio frequency coil according to claim 5, wherein said primary inductor loops are unconnected and each is in series with a respective capacitor, whereby said pair of primary inductor loops of said primary circuit are tuned.

7. The dedicated radio frequency coil according to claim 5, further comprising means for connecting said primary conductor loops in parallel.

8. The dedicated radio frequency coil according to claim 7, wherein said primary inductor loops are between said secondary inductor loops.

9. The dedicated radio frequency coil according to claim 7, wherein said secondary inductor loops are between said primary inductor loops.

10. The dedicated radio frequency coil according to claim 1, further comprising: adjusting means for adjusting the relative positions of said primary and secondary inductors with respect to each other for adjusting the inductive coupling between said primary and secondary tuned circuits.

11. The dedicated flexible radio frequency coil according to claim 10, wherein said secondary inductor comprises a pair of circular conductive loops each having the same radius and electrically connected in parallel and spaced apart a distance approximately equal to said loop radius;

wherein said primary conductor comprises a pair of conductive loops each having the same radius as said secondary inductor loops, each primary inductor loop being disposed adjacent and substantially symmetrical with a respective one of said secondary inductor loops for inductively coupling therewith; and wherein said adjusting means adjusts the spacing between said primary inductor loops and said secondary inductor loops for adjusting the inductive coupling.

12. The dedicated flexible radio frequency coil according to claim 10, wherein said secondary inductor comprises a pair of circular conductive loops each having the same radius and electrically connected in parallel and spaced apart a distance approximately equal to said loop radius;

wherein said primary conductor comprises a pair of conductive loops each having the same radius as said secondary inductor loops, each primary inductor loop being disposed adjacent and substantially symmetrical with a respective one of said secondary inductor loops for inductively coupling therewith, each secondary inductor loop being spaced the same distance from and on the same side of its respective primary inductor loop; and wherein said adjusting means adjusts the spacing between said primary inductor loops and said secondary inductor loops for adjusting the inductive coupling.

13. A dedicated flexible radio frequency coil for receiving MRI data from an anatomical region of interest of a subject, comprising:

a first loop comprising a first inductor, said first inductor having a first spatial region of substantially uniform sensitivity;

a second tuned loop comprising a second inductor, said second inductor having a second spatial region of substantially uniform sensitivity;

each of said first and second inductors, when disposed in a plane, having a major length dimension and a shorter width dimension, the portions of each of said first and second inductors extending in the length dimension being substantially straight and parallel to each other; and a flexible insulative sheet for wrapping around said region of interest of said subject, said first and second inductors being disposed on said flexible insulative sheet such that said straight and parallel portions of said first and second inductors are substantially parallel to one another, said first and second inductors are inductively coupled to each other, and said first and second spatial regions substantially totally overlap, wherein when said sheet is wrapped about the anatomical region of interest of said subject, respective end portions of each of said first and second inductors are adjacent to each other, and wherein each of said first and second inductors receive said MRI data from said anatomical region of interest.

14. The dedicated flexible radio frequency coil according to claim 13, wherein the length dimension of said second inductor is less than the length dimension of said first inductor, and said first and second inductors are disposed on said flexible sheet such that said first inductor surrounds said second inductor.

15. The dedicated flexible radio frequency coil according to claim 14, wherein said first and second inductors are disposed on the same side of said flexible sheet.

16. The dedicated flexible radio frequency coil according to claim 14, wherein said first and second inductors are disposed on opposite sides of said flexible sheet.

17. The dedicated flexible radio frequency coil according to claim 13, wherein said first and second inductors are disposed on opposite sides of said flexible sheet, the respective length dimensions of said first and second inductors are equal, and respective end portions of said first and second inductors are aligned on said flexible sheet so that the respective length dimensions of said first and second inductors are coextensive.

18. The dedicated flexible radio frequency coil according to claim 17, wherein the length and width dimensions of said second inductor are smaller than the length and width dimensions of said first inductor, said first inductor circumscribing said second inductor.

19. The dedicated flexible radio frequency coil according to claim 17, wherein said second inductor has the same width dimension as said first inductor.

20. The dedicated flexible radio frequency coil according to claim 19, wherein said first and second inductors respectively overlie and underlie each other.

21. The dedicated flexible radio frequency coil according to claim 19, wherein said first and second inductors are coextensive in length and displaced from one another along the width dimension.

22. The dedicated flexible radio frequency coil according to claim 13, wherein said flexible sheet is elongate and has a length approximately equal to the length of said first inductor disposed thereon, said first inductor having a pair of end edges along the width of said flexible sheet, said pair of end edges being adjacent to each other when said flexible sheet with said first and second inductors thereon is wrapped about said anatomical region of interest of said subject; and means for holding said pair of end edges of said first inductor adjacent to each other for maintaining the position of said flexible sheet on said subject.

23. The dedicated flexible radio frequency coil according to claim 22, wherein said means for holding comprises a pair of capacitors and means for connecting each of said capacitors across the respective ends of one of said first and second inductors for forming a tuned circuit, and means for transmitting said MRI data from said one of said first and second inductors forming the tuned circuit.

24. The dedicated flexible radio frequency coil according to claim 22, further comprising tuning means for tuning said first and second inductors.

25. A dedicated radio frequency coil for receiving and transmitting MRI data for an anatomical region of interest of a subject, comprising:

(a) a tuned primary circuit comprising a primary coil and a capacitor connected in series; and (b) a tuned secondary circuit comprising a secondary coil and a capacitor connected in series, said secondary coil inductively coupled to said primary coil for receiving said MRI data from said primary coil, said secondary coil comprising a pair of circular conductive loops each having the same radius and symmetric about a longitudinal axis therethrough and forming a substantially cylindrical shape thereabout, said loops being spaced from each other a distance substantially equal to the radius of said loops, each loop comprising a single discontinuous loop having a gap between a pair of confronting ends, and pair of links each connected between a respective end of one of said loops and the corresponding end of the other of said loops for connecting said loops in parallel; and (c) means for transmitting said MRI data from an output port across one of said capacitors of said tuned primary and secondary circuits.

26. The dedicated radio frequency coil according to claim 25, wherein said primary coil comprises a pair of circular conductive loops each having the same radius as said secondary coil loops and each substantially symmetric about said longitudinal axis and forming a substantially cylindrical shape thereabout between said secondary coil loops, each primary coil loop having a gap between a pair of confronting ends, said confronting ends of each primary coil loop being disposed along opposite sides of said pair of links of said secondary coil, and a second pair of links each connected between a respective end of one of said primary coil loops and the corresponding end of the outer of said primary coil loops for connecting said primary coil loops in parallel.

27. The dedicated radio frequency coil according to claim 25, wherein said primary coil comprises a single circular loop having the same diameter as said secondary coil loops and disposed adjacent and concentric with one of said secondary coil loops.

28. The dedicated radio frequency coil according to claim 27, further comprising a second circular primary coil loop having the same diameter as said secondary coil loops and disposed adjacent and concentric with the other one of said secondary coil loops.

29. A method for receiving MRI data from an anatomical region of interest of a subject during a magnetic resonance imaging procedure, comprising the following steps:

providing an inductively coupled radio frequency coil comprising a tuned primary circuit having a primary inductor and a tuned secondary circuit having a secondary inductor, said primary and secondary inductors each defining respective spatial regions of substantially uniform sensitivity, said spatial regions substantially totally overlapping each other;

positioning said inductively coupled coil proximate said anatomical region of interest of said subject such that said anatomical region of interest is received within said substantially totally overlapping regions;

irradiating said anatomical region of interest of said subject within said overlapping spatial regions to excite emission of MRI data therefrom; and receiving the emitted MRI data with said inductively coupled radio frequency coil.

30. The method according to claim 29, further comprising the step of changing the inductive coupling between said primary and secondary circuits before irradiating the anatomical region of interest of said subject.

31. The method according to claim 29, wherein the anatomical region of interest of said subject is irradiated by injecting radio frequency energy into one of said tuned primary and secondary circuits.

32. A radio frequency coil for transmitting radio frequency energy during a magnetic resonance imaging procedure to cause the emission of MRI data from an anatomical region of interest of a subject, comprising:

(a) a tuned primary circuit comprising a primary inductor and a primary capacitor connected in series, said primary inductor having a first spatial region of substantially uniform sensitivity; and (b) a tuned secondary circuit comprising a secondary inductor and a secondary capacitor connected in series, said secondary inductor having a second spatial region of substantially uniform sensitivity, said secondary inductor being inductively coupled to said primary inductor and positioned proximate said primary inductor such that said first and second regions substantially totally overlap, the overlapping regions defining a region for receiving said anatomical region of interest of said subject.

33. The radio frequency coil according to claim 32, wherein said primary and secondary inductors each comprise a pair of conductive loops symmetric about a longitudinal axis therethrough and forming a substantially cylindrical shape thereabout, said loops having the same radius and being spaced from each other a distance no greater than about the radius of said substantially cylindrical shape, and means for electrically connecting said primary conductor loops in parallel with each other and said secondary conductor loops in parallel with each other.

34. The dedicated radio frequency coil according to claim 32, wherein said primary and secondary inductors each comprise a pair of conductive loops substantially symmetric about a longitudinal axis therethrough and forming a substantially cylindrical shape thereabout, said primary inductor loops being electrically connected in parallel, each of said primary inductor loops having the same radius as said secondary inductor loops and being disposed adjacent and substantially symmetrical with a respective one of said secondary loops for inductively coupling therewith, each of said primary inductor loops being between said secondary inductor loops.

35. The dedicated radio frequency coil according to claim 33, wherein said primary and secondary inductors each comprise a pair of conductive loops substantially symmetric about said longitudinal axis therethrough and forming a substantially cylindrical shape thereabout, said secondary inductor loops being electrically connected in parallel, each secondary inductor loop having the same radius as said primary inductor loops and being disposed adjacent and substantially symmetrical with a respective one of said primary inductor loops for inductively coupling therewith, each of said secondary inductor loops being between said primary inductor loops.

36. A radio frequency coil for transmitting radio frequency energy to cause the emission of MRI data from an anatomical region of interest of a subject during a magnetic resonance imaging procedure, comprising:

a tuned primary circuit comprising a primary inductor and a primary capacitor connected in series, said primary inductor having a first spatial region of substantially uniform sensitivity;

a tuned secondary circuit comprising a secondary inductor and a secondary capacitor connected in series, said secondary inductor having a second spatial region of substantially uniform sensitivity;

each of said primary and secondary inductors, when disposed in a plane having a major length dimension and a shorter width dimension, the portions of each of said primary and secondary inductors extending in the length dimension being substantially straight and parallel; and a flexible insulative sheet for wrapping around said region of interest of said subject, said primary and secondary inductors being disposed on said flexible insulative sheet such that said straight and parallel portions of said primary and secondary inductors are substantially parallel to one another, said primary and secondary inductors are inductively coupled to each other, and said first and second spatial regions substantially totally overlap, wherein when said sheet is wrapped about said anatomical region of interest of said subject, respective end portions of each of said loops are adjacent to each other, and wherein each of said primary and secondary inductors receive said MRI data from said anatomical region of interest.

* * * * *

UNITED STATES PATENT AND TRADEMARK OFFICE
CERTIFICATE OF CORRECTION

PATENT NO. : 5,585,721
DATED : December 17, 1996
INVENTOR(S) : T. Datsikas

It is certified that error appears in the above-indentified patent and that said Letters Patent is hereby corrected as shown below:

Column 2, line 21, "in" should read --is--.

Column 8, line 58, "secondary" should read --primary--.

Column 10, line 33, after "and" insert --a--;
 line 51, "outer" should read --other--.

Signed and Sealed this

Seventeenth Day of June, 1997

*Attest:*

BRUCE LEHMAN

*Attesting Officer*     Commissioner of Patents and Trademarks